(12) United States Patent
Takano et al.

(10) Patent No.: US 8,440,285 B2
(45) Date of Patent: May 14, 2013

(54) COMPOSITE, PREPREG, LAMINATED PLATE CLAD WITH METAL FOIL, MATERIAL FOR CONNECTING CIRCUIT BOARD, AND MULTILAYER PRINTED WIRING BOARD AND METHOD FOR MANUFACTURE THEREOF

(75) Inventors: Nozomu Takano, Chikusei (JP); Masaki Kamiya, Chikusei (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 30 days.

(21) Appl. No.: 11/912,934

(22) PCT Filed: Apr. 21, 2006

(86) PCT No.: PCT/JP2006/308458
§ 371 (c)(1),
(2), (4) Date: Feb. 9, 2009

(87) PCT Pub. No.: WO2006/118059
PCT Pub. Date: Nov. 9, 2006

(65) Prior Publication Data
US 2009/0169808 A1  Jul. 2, 2009

(30) Foreign Application Priority Data

Apr. 27, 2005 (JP) ................. P2005-130227
Jun. 17, 2005 (JP) ................. P2005-178202

(51) Int. Cl.
*B32B 3/24* (2006.01)
*B32B 27/04* (2006.01)
*B32B 5/24* (2006.01)
*B32B 17/02* (2006.01)
*C08L 33/02* (2006.01)
*B32B 37/02* (2006.01)

(52) U.S. Cl.
USPC .......... 428/131; 428/40.1; 428/137; 428/220; 428/332; 428/461; 428/500; 428/901; 442/180; 524/556

(58) Field of Classification Search .................... None
See application file for complete search history.

(56) References Cited

U.S. PATENT DOCUMENTS 5,232,560 A   8/1993   Bell et al.
5,965,245 A * 10/1999  Okano et al. .............. 428/209
(Continued)

FOREIGN PATENT DOCUMENTS
EP  0 792 737 A2  9/1997
JP  62-161846     7/1987
(Continued)

OTHER PUBLICATIONS

English Translation of JP 08-097561 A, Apr. 1996.*
(Continued)

*Primary Examiner* — David Sample
*Assistant Examiner* — Jeff Vonch
(74) *Attorney, Agent, or Firm* — Griffin & Szipl, P.C.

(57) ABSTRACT

It is an object of the invention to provide a composite with sufficiently reliable bonding and adequately minimized generation of fluff from flaking resin dust and fibers. This object is achieved by the composite (100) of the invention that comprises a fiber sheet (101) impregnated with a resin composition (102), wherein the 20° C. storage elastic modulus of the cured resin composition (102) is 100-2000 MPa. The composite (100) optionally contains perforations (103).

12 Claims, 10 Drawing Sheets

U.S. PATENT DOCUMENTS

| | | | |
|---|---|---|---|
| 6,090,468 A * | 7/2000 | Shimada et al. | 428/137 |
| 6,459,046 B1 | 10/2002 | Ochi et al. | |
| 6,736,988 B1 | 5/2004 | Gaku et al. | |
| 2002/0086598 A1 | 7/2002 | Velpari et al. | |
| 2003/0032729 A1 * | 2/2003 | Takai et al. | 525/107 |
| 2003/0166796 A1 | 9/2003 | Imaizumi et al. | |

FOREIGN PATENT DOCUMENTS

| | | |
|---|---|---|
| JP | 5-32847 | 2/1993 |
| JP | 06-104545 | 4/1994 |
| JP | 6-268345 | 9/1994 |
| JP | 07-170046 | 7/1995 |
| JP | 08097561 A * | 4/1996 |
| JP | 08-222851 | 8/1996 |
| JP | 11-503715 | 3/1999 |
| JP | 2903411 | 3/1999 |
| JP | 2000-077800 | 3/2000 |
| JP | 2001-220565 | 8/2001 |
| JP | 2001-237550 | 8/2001 |
| JP | 2002-338875 | 11/2002 |
| JP | 2003-246838 | 9/2003 |
| JP | 2003-313324 | 11/2003 |
| JP | 2006-8788 | 1/2006 |
| JP | 2006-152260 | 6/2006 |
| JP | 2006-152261 | 6/2006 |
| KR | 2001-0051460 | 6/2001 |
| KR | 2003-0034106 | 5/2003 |

OTHER PUBLICATIONS

Gloeckner, Patrick, Radiation Curing, 2008 (no month given), Vincentz Network GmBH & Co KG, p. 147.*

The University of Southern Mississippi, Department of Polymer Science, 2005 (no month given).*

International Search Report issued in corresponding application No. PCT/JP2006/308458, completed Jun. 7, 2006 and mailed Jun. 13, 2006.

Office Action issued in corresponding Korean Patent Application issued Mar. 31, 2009.

Supplementary European Search Report issued in corresponding application No. EP 06 73 2216, completed Jul. 29, 2009 and mailed Aug. 5, 2009.

Office Action in a counterpart Chinese application issued on May 6, 2010.

Office Action issued in co-pending divisional U.S. Appl. No. 12/626,288, mailed Dec. 3, 2010.

Office Action issued in a counterpart Japanese application No. P2007-514689, mailed Dec. 21, 2010.

English Abstract corresponding to JP 08-097561 from Patent Abstracts of Japan (no date), filed herewith as Exhibit A1.

Multi Layer Board, Samsung (no date), 5 pages.

Tom Buck, "Laminate Materials and Reliability Issues for Pb-free Electronics," at http://www.smta.org/files/SMTA_Boston_pbfree_ddi.pdf (downloaded Oct. 22, 2012).

MCL-E-679 (W), at http://www.hitachi-chem.co.jp/english/products/bm/b02/files/bm_b02_001.pdf (downloaded Oct. 22, 2012.

* cited by examiner

COMPOSITE, PREPREG, LAMINATED PLATE CLAD WITH METAL FOIL, MATERIAL FOR CONNECTING CIRCUIT BOARD, AND MULTILAYER PRINTED WIRING BOARD AND METHOD FOR MANUFACTURE THEREOF

This is a National Phase Application in the United States of International Patent Application No. PCT/JP2006/308458 filed Apr. 21, 2006, which claims priority on Japanese Patent Application Nos. P2005-178202, filed Jun. 17, 2005 and P-2005-130227, filed Apr. 27, 2005. The entire disclosures of the above patent applications are hereby incorporated by reference.

TECHNICAL FIELD

The present invention relates to a composite, prepreg, metal foil-clad laminate and circuit board connection material, and a multilayer printed circuit board and a process for its production.

BACKGROUND ART

The popularity of electronic devices such as personal computers, word processors, video movie cameras and cellular phones in recent years has led to an ever increasing demand for multilayer printed circuit boards. A new feature of multilayer printed circuit boards is the formation of IVH (for example, see Patent document 1) as a type of electrical interlayer connecting means using non-penetrating via holes to increase wiring accommodation and surface mounting density, in order to meet demands for smaller and lighter-weight electronic devices with increased multifunctionality.

The conventional process for production of multilayer printed circuit boards will be explained first. FIG. 10 shows a conventional process for production of a multilayer printed circuit board with IVH. In FIG. 10, 6 is a multilayer printed circuit board, 61*a*, *b* are outer layer printed circuit boards, 62*a*, *b* are through-holes, 62*c*, *d* are copper plating layers, 63*a*, *b* are inner layer conductor patterns, 63*c* is a copper foil, 64 is a prepreg, 65*a*, *b* are outer layer conductor patterns, 66*a*, *b* are IVHs and 67 is a component hole.

First, an NC drill machine or the like is used to form through-hole perforations in a double-sided copper clad laminate obtained by laminating a copper foil 63*c* on both sides of a glass cloth base epoxy resin-laminated sheet, and then through-holes 62*a*, *b* are formed for electrical connection of both sides by copper plating, and a copper plating layer 62*c* is formed. A method such as etching is used to form inner layer conductor patterns 63*a*, *b* on one each of the sides of outer layer printed circuit boards 61*a*, *b* where the through-holes 62*a*, *b* and copper plating layer 62*c* have been formed. This yields surface-oxidized outer layer printed circuit boards 61*a*, *b* with through-holes 62*a*, *b* and inner layer conductor patterns 63*a*, *b*, as shown in FIG. 10(*a*).

After sandwiching a semi-cured prepreg 64 obtained by impregnating a glass cloth with an epoxy resin or the like between the outer layer printed circuit boards 61*a*, *b*, it is situated between a pair of stainless steel plates. The obtained laminate is set between the heating plates of a hot press machine (not shown) and then pressed and heated at a prescribed pressure and temperature for welding lamination of the outer layer printed circuit boards 61*a*, *b* and the prepreg 64, to form a multilayer copper clad laminate having inner layer conductor patterns 63*a*, *b* on the inner layer, as shown in FIG. 10(*b*).

After next forming perforations that can function as component holes 67 or mounting holes, copper plating 62*e* is again carried out to form a copper plating layer 62*e* on the surfaces of the component holes 67 and copper plating layers 62*c*, *d*. An etching resist is formed on the copper plating layer 62*e* surface by a screen printing method or photographic development method, and then etching is performed and the etching resist is released. This yields a multilayer printed circuit board 6 having formed thereon outer layer conductor patterns 65*a*, *b*, conductor-formed IVHs 66*a*, *b* and throughholes as component holes 67/mounting holes, as shown in FIG. 10(*c*).

The prepreg used for manufacture of this type of multilayer printed circuit board may be one as described in Patent document 2, for example.

[Patent document 1] Japanese Unexamined Patent Publication HEI No. 6-268345

[Patent document 2] Japanese Patent Publication No. 2904311

DISCLOSURE OF THE INVENTION

Problems to be Solved by the Invention

Still, conventional multilayer printed circuit boards including those obtained in the manner described above may have dents on the wiring boards during production or experience breakage in the wirings, and therefore the reliability has not been sufficient. These defects tend to occur more frequently when the layer thicknesses are reduced to achieve high density.

As a result of examining the cause of such defects in detail, the present inventors have discovered that an insulating sheet obtained from a semi-cured prepreg prepared by impregnating a glass cloth with an epoxy resin or the like is susceptible to flaking of resin dust and fibers and is a major cause of the aforementioned defects.

When a material that is simply resistant to resin dust and fiber flaking is used as the insulating sheet, the insulating sheet usually fails to exhibit sufficiently reliable bonding as an insulating substrate for use in a multilayer printed circuit board. It has therefore been difficult to obtain thin printed circuit boards with sufficient reliability.

The present invention overcomes this obstacle, and one of its objects is to provide a composite with excellent reliable bonding and minimized generation of fluff from flaking resin dust and fibers which may fall. It is another object of the invention to provide a prepreg, metal foil-clad laminate, circuit board connection material and multilayer printed circuit board that employ the composite, as well as a process for production for the latter.

Means for Solving the Problems

In order to achieve these objects, the composite of the invention comprises a resin composition and a fiber sheet disposed in the resin composition, wherein the cured resin composition has a storage elastic modulus of 100-2000 MPa at 20° C. The storage elastic modulus of the resin composition may be, for example, the value obtained by measurement of the dynamic viscoelasticity in tensile mode (span distance=5-30 mm) with a cured product measuring frequency of 1-100 Hz. With this type of composite, the resin composition will become impregnated into the fiber sheet.

Since the resin composition having a cured product storage elastic modulus in the range specified above is impregnated in the fiber sheet, the composite of the invention has satisfactorily reduced flaking of resin dust and fibers. Moreover, since the post-curing storage elastic modulus of the resin composition is within the range specified above, the reliability of bonding is sufficiently high. Consequently, the composite of the invention can be used as a material for an insulating substrate to produce multilayer printed circuit boards with excellent reliability.

If the 20° C. storage elastic modulus of the curable resin composition after curing is less than 100 MPa, the handleability and dimensional stability will be reduced and it may be difficult to obtain sufficient reliability of bonding. On the other hand, if it exceeds 2000 MPa the cured resin will be brittle, making it difficult to sufficiently inhibit flaking of resin dust and fibers.

The resin composition in the composite of the invention preferably contains a viscoelastic resin. This will ensure that the composite inhibits flaking of resin dust and fibers while exhibiting even more reliable bonding.

The resin composition in the composite of the invention contains an acrylic polymer with a weight-average molecular weight of 30,000 or greater, and the acrylic polymer preferably contains 2-20 wt % glycidyl acrylate as a polymerizing component and has an epoxy value of 2-36. The epoxy value referred to here is the number of moles of epoxy groups per 100 g of sample (eq./100 g), and throughout the present specification it is assumed to be the epoxy value as measured by HLC.

If the weight-average molecular weight of the acrylic polymer is less than 30,000, the flexibility of the cured resin composition will be reduced and the polymer will tend to be brittle. If the content of glycidyl acrylate as a polymerizing component in the acrylic polymer is less than 2 wt %, the glass transition temperature Tg of the cured product will be reduced and the heat resistance will tend to be inadequate. On the other hand, a content of greater than 20 wt % will increase the storage elastic modulus of the cured product, tending to prevent resin dust and fibers from being adequately inhibited. If the epoxy value of the acrylic polymer is less than 2, the glass transition temperature Tg of the cured product will be reduced, tending to result in inadequate heat resistance, while a value of greater than 36 will increase the storage elastic modulus of the cured product, tending to prevent resin dust and fibers from being adequately inhibited.

The fiber sheet in the composite of the invention is preferably a glass cloth with a thickness of 10-200 μm. Such a composite has sufficient mechanical strength and high dimensional stability, and using the composite can yield an insulating substrate which is suitable for easily achieving high density of multilayer printed circuit boards.

The total thickness of the composite of the invention is preferably no greater than 200 μm and more preferably no greater than 100 μm. This will further facilitate achievement of high density when the composite is used as an insulating substrate in a multilayer printed circuit board.

The composite of the invention preferably has perforation running in the direction of thickness. Such a composite having perforations already formed at prescribed location will allow the step of forming perforations to be omitted. Using such a composite, therefore, it is possible to produce highly reliable multilayer printed circuit boards with an IVH structure at a high yield.

The prepreg of the invention is characterized by being a composite of the invention wherein the resin composition is semi-cured.

The prepreg of the invention contains the aforementioned semi-cured resin composition, and thereby has sufficiently inhibited flaking of resin dust or fibers while also exhibiting adequately high reliability of bonding. A prepreg of the invention can therefore be used to produce a multilayer printed circuit board with an IVH structure, to obtain a highly reliable multilayer printed circuit board.

The prepreg of the invention preferably has perforation running in the direction of thickness. This type of prepreg which has perforations already formed at prescribed location allows the step of forming perforation to be omitted, and using such a prepreg will further facilitate production of a highly reliable multilayer printed circuit board with an IVH structure.

The metal foil-clad laminate of the invention is characterized by being the aforementioned composite of the invention with perforation, obtained by filling an electric conductor into the perforation, laying a metal foil over at least one side of the composite and subjecting the laminate to heating and pressure. This type of metal foil-clad laminate has a metal foil laid over at least one side of the composite of the invention comprising perforation, while the resin composition in the composite is cured and an electric conductor extends in the direction of thickness through the inner walls of the perforations.

The metal foil-clad laminate is obtained using the composite of the invention as described above, and therefore flaking of resin dust and fibers is sufficiently inhibited. The composite in the metal foil-clad laminate also has a satisfactory level of bonding reliability. A metal foil-clad laminate of the invention can therefore be used to produce a multilayer printed circuit board with an IVH structure, to obtain a highly reliable multilayer printed circuit board at a high yield.

The same metal foil-clad laminate may be one employing a prepreg according to the invention. That is, the metal foil-clad laminate of the invention is characterized in that it is obtained by filling an electric conductor into the perforation of a prepreg of the invention as described above which has perforation, laying a metal foil on at least one side of the prepreg, and subjecting the laminate to heating and pressure. This type of metal foil-clad laminate has a metal foil laid over at least one side of the prepreg of the invention comprising perforation, while the semi-cured resin composition in the prepreg is further cured and an electric conductor extends in the direction of thickness through the inner walls of the perforation.

Since the metal foil-clad laminate is obtained using a prepreg of the invention, it has minimal flaking of resin dust and fibers and the prepreg part exhibits satisfactorily high reliability of bonding. This type of metal foil-clad laminate can therefore be used to produce a multilayer printed circuit board with an IVH structure, to obtain a highly reliable multilayer printed circuit board at a high yield.

The invention further provides a circuit board connection material employing the prepreg of the invention described above. Specifically, the circuit board connection material of the invention is characterized by having perforation formed at prescribed location of the prepreg of the invention bearing a releasable film on both sides, with a conductive resin composition filling the perforation up to the surface of the releasable film.

The circuit board connection material of the invention is used after peeling the releasable film from the surface. Therefore, the circuit board connection material of the invention, which has perforation formed at prescribed location of the prepreg of the invention bearing a releasable film on both sides thereof and a conductive resin composition filling the perforation up to the surface of the releasable film, may have protrusion of the conductive resin composition from the surface of the prepreg when the releasable film is subsequently peeled off.

The circuit board connection material of the invention has "vias" composed of a conductive resin composition at prescribed locations of a prepreg obtained from a composite of the invention. This type of circuit board connection material is therefore highly resistant to flaking of resin dust and fibers, as mentioned above. The circuit board connection material is also well suited for fine via pitches, allowing circuit boards with intricate conductor patterns to be satisfactorily bonded together.

Furthermore, since the circuit board connection material has a conductive resin composition filled up to the releasable film surface, the conductive resin composition will protrude when the releasable film is peeled off during use. Consequently, the circuit board connection material of the invention allows good electrical connections to be formed even between circuit boards with intricate conductor patterns.

The invention still further provides a process for production of a multilayer printed circuit board employing the aforementioned circuit board connection material. Specifically, the process for production of a multilayer printed circuit board according to the invention is characterized by placing a circuit board connection material of the invention as described above between a circuit board having at least a two-layer conductor pattern and a circuit board having at least a one-layer conductor pattern, and heating and pressing the laminate.

The process for production of a multilayer printed circuit board described above may also be characterized by placing a circuit board connection material of the invention as described above on either side of a circuit board having at least a two-layer conductor pattern, further placing a metal foil on the outer sides of the circuit board connection material and heating and pressing the laminate, and then working the metal foil to form a conductor pattern.

In this production process for a multilayer printed circuit board, connection between the circuit boards or connection between the circuit board on the inner layer circuit board and the metal foil as the outer layer conductor pattern is achieved using the circuit board connection material of the invention. This production process can therefore yield a multilayer printed circuit board with vastly reduced flaking of resin dust and fibers from the circuit board connection material. It also allows fine via pitches to be achieved to easily yield a multilayer printed circuit board with an intricate conductor pattern.

The multilayer printed circuit board of the invention is characterized by being obtained by forming a multilayer board by alternate lamination of an insulating sheet obtained by forming first perforation on the prepreg described above or a prepreg laminate comprising a plurality of laminated prepregs and filling or coating the first perforation with a conductive paste, and an inner layer printed circuit board having a conductor pattern formed on its surface, forming a laminated sheet by lamination of a copper foil on both sides of the multilayer board, forming second perforation running through both sides of the laminated sheet, forming a conductive layer on the wall of the perforation, and forming an outer layer conductor pattern on one or both sides of the laminated sheet.

The production process for a printed circuit board according to the invention is characterized by comprising a step of bonding a film onto both sides of the aforementioned prepreg or of a prepreg laminate comprising a plurality of the prepregs, and then forming first perforation for communication between the surfaces of both films, a step of filling or coating the first perforation with a conductive paste and then peeling the film from the prepreg or prepreg laminate to form an insulating sheet, a step of bonding copper foils to both sides of the insulating sheet and then etching portions of the copper foils for removal to form inner layer conductor patterns, in order to obtain an inner layer printed circuit board, a step of alternately laminating the insulating sheet and the inner layer printed circuit board to form a multilayer board and laminating copper foils onto both sides of the multilayer board to form a laminated sheet and subsequently or simultaneously compressing the laminated sheet to a compressibility ratio of 0-10% in the direction of lamination to form a copper-clad insulating substrate, and a step of forming second perforation in the copper-clad insulating substrate, and then forming a conductive layer by copper plating on the surface including the second perforation and etching portions of the conductive layer and the copper foil on the copper-clad insulating substrate surface for removal to form an outer layer conductor pattern.

Another aspect of the production process for a multilayer printed circuit board according to the invention is characterized by comprising a step of bonding first films onto both sides of the aforementioned prepreg or of a prepreg laminate comprising a plurality of the prepregs, and then forming first perforation for communication between the surfaces of the first films, a step of filling or coating the first perforation with a conductive paste and then peeling off the first films from the prepreg or prepreg laminate to form an insulating sheet, a step of bonding second films to both sides of an insulating sheet having an inner layer conductor pattern formed on the surface thereof and then forming second perforation for communication between the surfaces of the second films, a step of filling or coating the second perforation with a conductive paste and then peeling off the second films to form an inner layer printed circuit board, a step of alternately laminating the insulating sheet and the inner layer printed circuit board to form a multilayer board, laminating copper foils onto both sides of the multilayer board to form a laminated sheet and subsequently or simultaneously compressing the laminated sheet to a compressibility ratio of 0-10% in the direction of lamination to form a copper-clad insulating substrate, and a step of forming second perforation in the copper-clad insulating substrate, and then forming a conductive layer by copper plating on the surface including the second perforations and etching portions of the conductive layer and copper foils on the copper-clad insulating substrate surface for removal to form an outer layer conductor pattern.

Still another aspect of the process for production of a multilayer printed circuit board according to the invention is characterized by comprising a step of attaching first films onto both sides of the aforementioned prepreg or of a prepreg laminate comprising a plurality of the prepregs and then forming first perforation for communication between the surfaces of the first films, a step of filling or coating the first perforation with a conductive paste and then peeling off the first films from the prepreg or prepreg laminate to form an inner layer insulating sheet, a step of attaching copper foils to both sides of the inner layer insulating sheet and then etching portions of the copper foils on one of the copper foil sides for removal, to form a conductor pattern in order to obtain an outer layer printed circuit board, a step of laminating the inner layer insulating sheet and two outer layer printed circuit boards in such a manner that the outer layer printed circuit boards sandwich the inner layer insulating sheet and the conductor pattern is on the back, to form a laminated sheet, and subsequently or simultaneously compressing the laminated sheet to a compressibility ratio of 0-10% in the direction of lamination to form a copper-clad insulating substrate, and a step of forming second perforation in the copper-clad insulating substrate, and then forming a conductive layer by copper plating on the surface including the second perforation and etching a portion of the conductive layer and the copper foil on the copper-clad insulating substrate surface for removal to form an outer layer conductor pattern.

Since these production processes for a multilayer printed circuit board according to the invention employ the prepreg of the invention as described above, it is possible to produce multilayer printed circuit boards at a satisfactorily high yield. Moreover, because a multilayer printed circuit board obtained in this manner comprises a prepreg of the invention, it is resistant to flaking of resin dust and fibers from the insulating sheet and exhibits adequate reliability.

Two or more plating treatments have been required to form copper plating layers on IVH through-holes, component holes and mounting holes in the production of conventional multilayer printed circuit boards. The manufacturing steps for multilayer printed circuit boards has therefore been complicated, and production costs have as a result been high. In conventional production processes, the resin that has been softened and melted from the prepreg elutes out from the through-holes of the external layer printed circuit board in the course of pressing and heating during molding of a multilayer copper clad laminate, and it tends to adhere onto the surface of the multilayer copper clad laminate after lamination. It has therefore been necessary to construct means for removing the adhering resin or means for preventing adhesion of the resin during lamination, and such means further complicate the production process. Moreover, since conventional production processes have required that the outer layer conductor pattern have a three-layer structure comprising a copper foil, a copper plating layer for formation of through-holes in the outer layer printed circuit board and a copper plating layer for formation of through-holes as component holes and mounting holes, it has been difficult to form high density and high precision patterns.

The process for production of a multilayer printed circuit board according to the invention, however, can achieve communication between layers by selectively filling or coating conductive paste only in the perforations beforehand, so that the number of copper plating operations can therefore be reduced. This can prevent excessive increase in the thickness of the outer layer conductor pattern due to repetitive copper plating, to allow formation of high precision outer layer conductor patterns.

Effect of the Invention

According to the invention it is possible to provide a composite with sufficiently reliable bonding and adequately minimized generation of fluff from flaking resin dust and fibers which may falls. Also according to the invention, it is possible to provide a prepreg, metal foil-clad laminate and circuit board connection material which are suitable for manufacture of a multilayer printed circuit board (multilayer circuit board) comprising the aforementioned composite. It is also possible to provide a multilayer printed circuit board with excellent reliability that employs the above, and a process for its production.

EXPLANATION OF SYMBOLS

Figure 1:
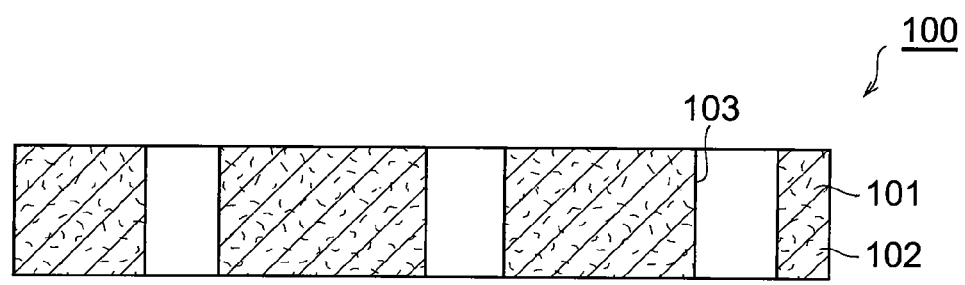
FIG. 1 is a drawing schematically showing the cross-sectional structure of a composite according to an embodiment of the invention.

100: Composite, 101: fiber sheet, 102: resin composition, 103: perforation, 200: prepreg, 201: fiber sheet, 202: semi-cured resin layer, 203: perforation, 300: metal foil-clad laminate, 301: insulating substrate, 302: electric conductor layer, 303: perforation, 304: electric conductor, 402: releasable film, 404: perforation, 406: via, 410: circuit board connection material, 620, 640: double-sided sheets, 610: circuit board connection material, 730: inner layer circuit board, 710a, 710b: circuit board connection materials, 740a, 740b: copper foils, 4: multilayer printed circuit board, 42a: inner layer conductor pattern, 42b: outer layer conductor pattern, 42c: copper foil, 42d: conductive layer, 43a, 43b, 43c, 43d: perforations, 45a, 45b, 45c: insulating sheets, 46: inner layer printed circuit board, 47: copper-clad multilayer insulating substrate.

BEST MODE FOR CARRYING OUT THE INVENTION

Preferred embodiments of the invention will now be explained in detail, with reference to the accompanying drawings as necessary. Identical elements in the drawings will be referred to by like reference numerals and will be explained only once. The vertical and horizontal positional relationships are based on the positional relationships in the drawings, unless otherwise specified. Also, the dimensional proportions depicted in the drawings are not necessarily limitative.

[Composite]

A composite according to a preferred embodiment will be explained first.

FIG. 1 is a drawing schematically showing the cross-sectional structure of a composite according to one embodiment. The composite 100 has a structure wherein a fiber sheet 101 is disposed in a resin composition 102. The composite 100 is obtained by impregnating the fiber sheet 101 with the curable resin composition 102. The composite 100 also contains perforations 103.

The fiber sheet 101 may be, for example, a fiber fabric (woven fabric or nonwoven fabric) composed of heat resistant synthetic fibers such as aramid or glass fibers, or paper or the like. A glass fiber woven fabric or glass fiber nonwoven fabric is preferred among these, and a glass fiber woven fabric is particularly preferred. The glass material may be E glass, S glass, D glass or the like. The fiber weaving method when a woven fabric is used as the fiber sheet may be, for example, a plain weave, satin weave or twill weave.

The thickness of the fiber sheet 101 is preferably as small as possible within a range that permits the composite 100 to exhibit sufficient strength. Specifically, it is preferably 10-200 μm, for example, more preferably 10-80 μm and even more preferably 15-80 μm. A fiber sheet 101 with a lower linear expansion coefficient is preferred.

The resin composition 102 is a curable resin composition, and the 20° C. storage elastic modulus of the cured product is 100-2000 MPa and preferably 100-1800 MPa. The resin composition is more preferably one that yields a cured product with this range of storage elastic modulus even at 25° C. As examples of such resin compositions there may be mentioned those containing curable resins and curing agents that cure the curable resins. The resin component of the curable resin is preferably a viscoelastic resin, and as examples there may be mentioned epoxy resins, rubber-modified epoxy resins, styrene-butadiene rubber (SBR), acrylonitrile-butadiene rubber (NBR), carboxyl-terminated butadiene-acrylonitrile copolymer rubber (CTBN), BT resins, acrylic resins (acrylic-based polymers), polyamides, polyamideimides, silicone-modified polyamideimides and the like. As curing agents there may be mentioned dicyandiamides, phenol resins, imidazoles, amine compounds, acid anhydrides and the like.

The resin composition 102 may also be used as a varnish containing a prescribed solvent, for the purpose of facilitating impregnation into the fiber sheet. As solvents there may be used aromatic hydrocarbon-based solvents such as benzene, toluene, xylene and trimethylbenzene; ether-based solvents such as tetrahydrofuran; ketone-based solvents such as acetone, methyl ethyl ketone and methyl isobutyl ketone; glycol ether-based solvents such as methylcellosolve and diethylene glycol; ester-based solvents such as methylcellosolve acetate; dialkyl glycol-based solvents such as ethyleneglycol dimethyl ether; amide-based solvents such as N-methylpyrrolidone, N,N'-dimethylformamide and N,N'-dimethylacetamide; alcohol-based solvents such as methanol, butanol and isopropanol; and ether alcohol-based solvents such as 2-methoxyethanol and 2-butoxyethanol, any of which may be used alone or in combinations.

The resin composition is preferably a combination of a curable acrylic polymer and a curing agent that cures the acrylic polymer. In this case, the curing agent is most preferably used at 60-350 parts by weight with respect to 100 parts by weight of the acrylic polymer. If the amount of curing agent is less than 60 parts by weight with respect to 100 parts by weight of the acrylic polymer, the storage elastic modulus of the cured will be below 300 MPa and the handleability will tend to be reduced. In addition, the glass transition temperature (Tg) of the cured product will be lower, and problems such as dimensional shrinkage due to deterioration when standing at high temperature and solder heat resistance reduction will tend to occur more easily. If the proportion of curing agent is greater than 350 parts by weight, the cured product will more often have a storage elastic modulus exceeding 2000 MPa. This will cause the cured product to be brittle and more prone to flaking of resin dust and fibers.

The acrylic polymer preferably has a weight-average molecular weight (Mw) of at least 30,000 and more preferably at least 50,000. The acrylic polymer also preferably contains glycidyl acrylate at preferably 2-20 wt % and more preferably 2-15 wt % as a polymerizing component, and also the epoxy value is preferably 2-36 and more preferably 3-30.

If the resin composition 102 contains an acrylic-based polymer satisfying these conditions, the cured resin composition 102 will more readily have an elastic modulus in the range specified above and will also exhibit satisfactory heat resistance. If the epoxy value of the acrylic-based polymer is less than 2, the Tg of the cured resin composition 102 will be reduced, so that the heat resistance of the insulating layer composed of the composite 101 will tend to be insufficient. On the other hand if the epoxy value exceeds 36, the elastic modulus of the cured product will be excessively large, tending to result in a brittle insulating layer.

The composite 100 having such a construction may be produced in the following manner as an example. Specifically, there may be mentioned a method in which the resin composition 102 is impregnated into the fiber sheet 101 and dried, and then perforations 103 are formed at prescribed locations. The method of impregnating the resin composition 102 into the fiber sheet 101 may be, for example, a wet or dry method for impregnation of the fiber sheet 101 with a solution of the resin composition 102, or a method of coating the resin composition 102 onto the fiber sheet 101.

[Prepreg]

A preferred embodiment of a prepreg will now be explained.

Figure 2:
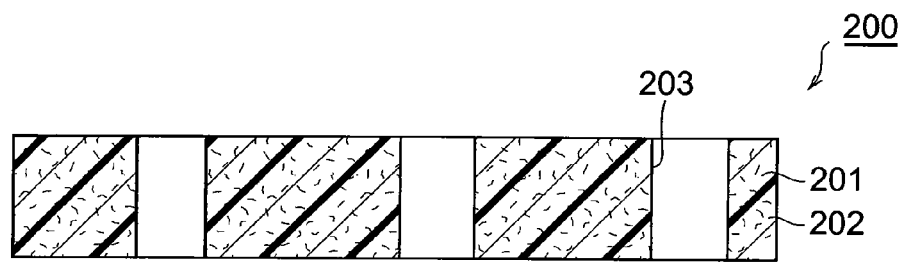
FIG. 2 is a drawing schematically showing the cross-sectional structure of a prepreg according to an embodiment of the invention.

FIG. 2 is a drawing schematically showing the cross-sectional structure of a prepreg according to this embodiment. The prepreg 200 shown in FIG. 2 is constructed of a semi-cured resin layer 202 obtained by semi-curing of a resin composition, and a fiber sheet 201 disposed in it. The prepreg 200 comprises the fiber sheet 201 and a semi-cured resin layer 202 composed of a semi-cured resin composition impregnated into the sheet. The prepreg 200 also contains perforations 203. The resin composition and fiber sheet 201 composing the prepreg 200 are preferably the same as in the composite 100 described above.

The prepreg 200 having such a construction can be produced, for example, by performing the treatment described below on the composite 100 having the aforementioned perforations 103, for semi-curing of the resin composition 102 in the composite 100. In the prepreg 200 obtained in this manner, the fiber sheet 201 is the same as the fiber sheet 101, and the semi-cured resin layer 202 is obtained by semi-curing of the resin composition 102. The prepreg 200 can be produced by a method wherein the resin composition is impregnated into the fiber sheet 201 and dried, and then the resin composition is semi-cured to form the semi-cured resin layer 202 and perforations 203 are formed at prescribed locations.

The method of semi-curing the resin composition to form the semi-cured resin layer 202 may be a method such as heating, ultraviolet irradiation, electron beam irradiation or the like. For example, when the semi-curing is accomplished by heating, suitable conditions may be a heating temperature of 100-200° C. and a heating time of 1-30 minutes.

The semi-cured resin layer 202 in the prepreg 200 is preferably cured to a resin composition curing ratio of 10-70%. If the curing ratio is less than 10% and the prepreg 200 has been integrated with an electric conductor, irregularities in the fiber sheet will be reflected on the surface of the electric conductor, tending to reduce the surface smoothness. Control of the thickness of the insulating layer made of the prepreg 200 will also tend to be difficult. On the other hand, a resin composition curing ratio of greater than 70% will result in a lack of uncured resin component in the semi-cured resin layer 202, such that the resin component will not be sufficiently present when the electric conductor is integrated at high speed, tending to create bubbles and thin spots. This will create a condition of poor adhesive force with the electric conductor.

[Metal Foil-Clad Laminate]

A metal foil-clad laminate according to a preferred embodiment will now be explained.

Figure 3:
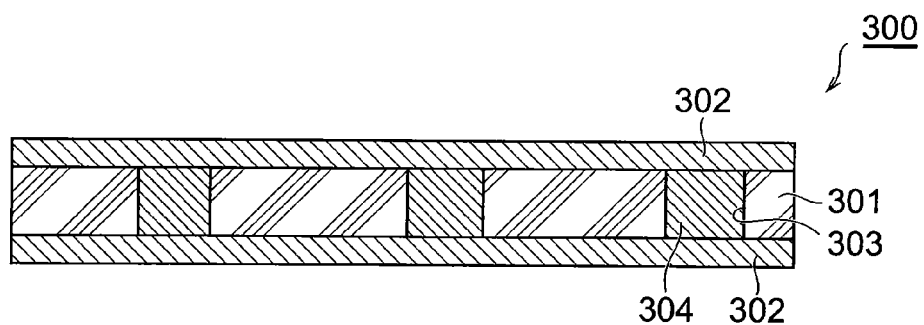
FIG. 3 is a drawing schematically showing the cross-sectional structure of a metal foil-clad laminate according to an embodiment of the invention.

FIG. 3 is a drawing schematically showing the cross-sectional structure of a metal foil-clad laminate according to one embodiment. The metal foil-clad laminate 300 shown in FIG. 3 is constructed of an insulating substrate 301 with perforations 303, an electric conductor 304 filling the perforations 303 and a pair of electric conductor layers 302 laminated on both sides of the insulating substrate 301.

The constituent material of the electric conductor layer 302 may be, for example, a metal foil such as copper foil, aluminum foil, nickel foil or the like. The electric conductor layer 302 in the metal foil-clad laminate 300 is preferably a copper foil, and its thickness is preferably 1-70 μm. The copper foil used may be an electrolytic copper foil or a rolled copper foil.

The electric conductor layer 302 is not limited to being composed of such metal foils, and it may be one composed of a metal, a conductive organic substance, or a conductive film made of a combination thereof. As specific examples there may be mentioned films obtained by heating and pressing conductive pastes containing metals such as gold, silver, nickel, copper, platinum and palladium, metal oxides such as ruthenium oxide, or organometallic compounds comprising such metals.

The insulating substrate 301 comprises the aforementioned composite 100 or prepreg 200, and has the electric conductor 304 filled into the perforations 103 or 203. The electric conductor 304 in the metal foil-clad laminate 300 functions as "via" material to provide electrical connection between the pair of electric conductor layers 302 formed on the front and back of the insulating substrate 301.

The metal foil-clad laminate 300 having such a construction can be fabricated by the following method. For example, when the insulating substrate 301 comprises the aforementioned prepreg 200, first the conductive paste is filled into the perforations 203 of the prepreg 200 to form an electric conductor 304. The conductive paste may one ordinarily used for via formation in multilayer interconnection boards and the like, without any particular restrictions. The metal foil-clad laminate 300 can be fabricated by using the composite 100 instead of the prepreg 200. The electric conductor 304 for via formation may also be formed using metal powder instead of conductive paste.

Next, the metal foil described above is stacked on both surfaces of the prepreg 200 on which the electric conductor 304 has been formed and integrated therewith to obtain a metal foil-clad laminate 300. The method of integration may be, for example, metallizing, press lamination, heated roll continuous lamination or the like. Of these, press lamination is preferably used from the standpoint of efficiently forming an electric conductor layer. When the metal foil and the prepreg or composite are integrated by press lamination, the heating and pressing conditions are preferably, for example, a temperature of 120-260° C. and preferably 120-230° C., a pressure of 1.0-8.0 MPa or 10-60 kg/cm$^2$ and a heating time of 30-120 minutes.

The metal foil-clad laminate 300 may also include, between the insulating substrate 301 and the electric conductor layer 302, a resin layer composed of the same resin composition as in the composite 100 or prepreg 200 of the insulating substrate 301. In the metal foil-clad laminate 300, this resin layer will integrate with the resin composition in the insulating substrate 301 to become part of the insulating substrate 301. With this manner of construction, irregularities on the surface of the composite 100 or prepreg 200 deriving from the fiber sheet 101 or 201 will be attenuated due to the resin layer, to more easily yield a metal foil-clad laminate 300 with a smooth surface. A metal foil-clad laminate 300 having such a construction can also be produced, for example, by coating a resin composition on the surface of the metal foil of the electric conductor layer 302 and then attaching the metal foil to the composite 100 or prepreg 200 with its coated side in contact therewith.

The metal foil-clad laminate does not necessarily have to bear the electric conductor layer on both sides of the insulating substrate, as it may be in a form with the layer situated only on one side. The structure described here has the electric conductor 304 as via filling the perforations 103 or 203, but the via is not limited to such a structure so long as communication is established at least between the front and back sides of the insulating substrate 301. Specifically, it may have a form with the electric conductor linking both edges of the inner walls of the perforations 103 or 203 in the direction of thickness of the insulating substrate. For example, an electric conductor layer may be formed on the surface of the inner walls of the perforations 103, 203.

[Circuit Board Connection Material]

A circuit board connection material according to a preferred embodiment will now be explained.

FIG. 4(a)-(c) is a cross-sectional process diagram of production steps for a circuit board connection material. As shown in FIG. 4(a), first a releasable film 402 made of polyester or the like is attached to the front and back sides of a prepreg 400. The prepreg 400 is obtained by semi-curing of the resin composition in the composite comprising the fiber sheet disposed in the resin composition, and it corresponds to the aforementioned prepreg 200 without perforations. As the releasable film 402 there may be mentioned a plastic film having an Si-based release agent coated on the bonding surface. Specifically, polyethylene terephthalate (PET) or polypropylene (PP) is preferred.

The method of attaching the releasable film 402 to the prepreg 400 may be, for example, a method in which the releasable film 402 is situated on both sides of the prepreg and sandwiched with a pair of stainless steel plates, and then heated and pressed. The heating conditions are preferably such that the (semi-cured) resin composition in the prepreg is not completely cured. The heating and pressing cause compression of the prepreg 400, thus reducing pores 408 that are produced during manufacture of the prepreg 400.

As shown in FIG. 4(b), perforations 404 running through the front and back surfaces are formed at prescribed locations of the prepreg 400 bearing the releasable film 402 on both sides. The method of forming the perforations 404 is not particularly restricted, but a method using a laser, such as carbon dioxide gas laser working, is preferred. This allows formation of small perforations at any location to facilitate fine patterning of the via 406 described hereunder.

Next, as shown in FIG. 4(c), a conductive resin composition is filled into the perforations 404 formed in the manner described above to create vias 406 and obtain a circuit board connection material 410. The conductive resin composition may be a conductive paste containing a conductive filler and a thermosetting resin. The method of filling the conductive resin composition into the perforations 404 may be, for example, a method of printing the conductive paste using a printer. As specific examples there may be mentioned the squeegee method and the roll transfer method. Irregularities where the pores 408 are exposed will form on the inner walls surfaces of the perforations 404.

The conductive filler is preferably a metal filler containing one or more from among silver, copper, nickel and the like. The conductive filler may be in the shape of spheres or flakes, without any particular restrictions. From the standpoint of obtaining excellent conductivity when the circuit board connection material 410 is applied for connection, the conductive filler is preferably dispersed at high concentration in the conductive paste. For this reason, a conductive filler with a small area-to-weight ratio is preferred, and for example, when the mean particle size of the conductive filler is in the range of 0.1-20 μm, the value of the area-to-weight ratio is preferably about 0.1-1.5 m$^2$/g.

The thermosetting resin is preferably a combination of an epoxy resin and the epoxy resin curing agent. As epoxy resins there may be mentioned bisphenol A-type epoxy resins, bisphenol F-type epoxy resins, alicyclic epoxy resins, amine-type epoxy resins and various novolac-type epoxy resins containing two or more epoxy groups.

As epoxy resin curing agents there may be mentioned amine-based curing agents such as dicyandiamide and carboxylic acid hydrazide, urea-based curing agents such as 3-(3,4-dichlorophenyl)-1,1-dimethylurea, acid anhydride-based curing agents such as phthalic anhydride, methylnadic anhydride, pyromellitic anhydride and hexahydrophthalic anhydride, aromatic amine-based (amine adduct) curing agents such as diaminodiphenylmethane and diaminodiphenylsulfonic acid, and phenol resins including various novolac types. Thermosetting resins including these preferably have a volatile component content of no greater than 2.0 wt % in order to reduce generation of voids due to volatilization of the volatile components during the treatment of heating and pressing.

The circuit board connection material 410 obtained in this manner has the conductive resin composition filling in up to the releasable film 402 surface, in the perforations 404 formed at prescribed locations of the prepreg 400 bearing the releasable film 402 on both sides.

[Printed Circuit Board]

A preferred construction and production process for a printed circuit board of the invention will now be explained using the following first to fourth embodiments as examples.

First Embodiment

A printed circuit board according to the first embodiment and a process for its production will be explained first. The printed circuit board of the first embodiment is a double-sided circuit board having a conductive layer on both sides of the board. FIG. 5(a)-(d) is a cross-sectional process diagram showing production steps for the printed circuit board of the first embodiment.

Figure 5:
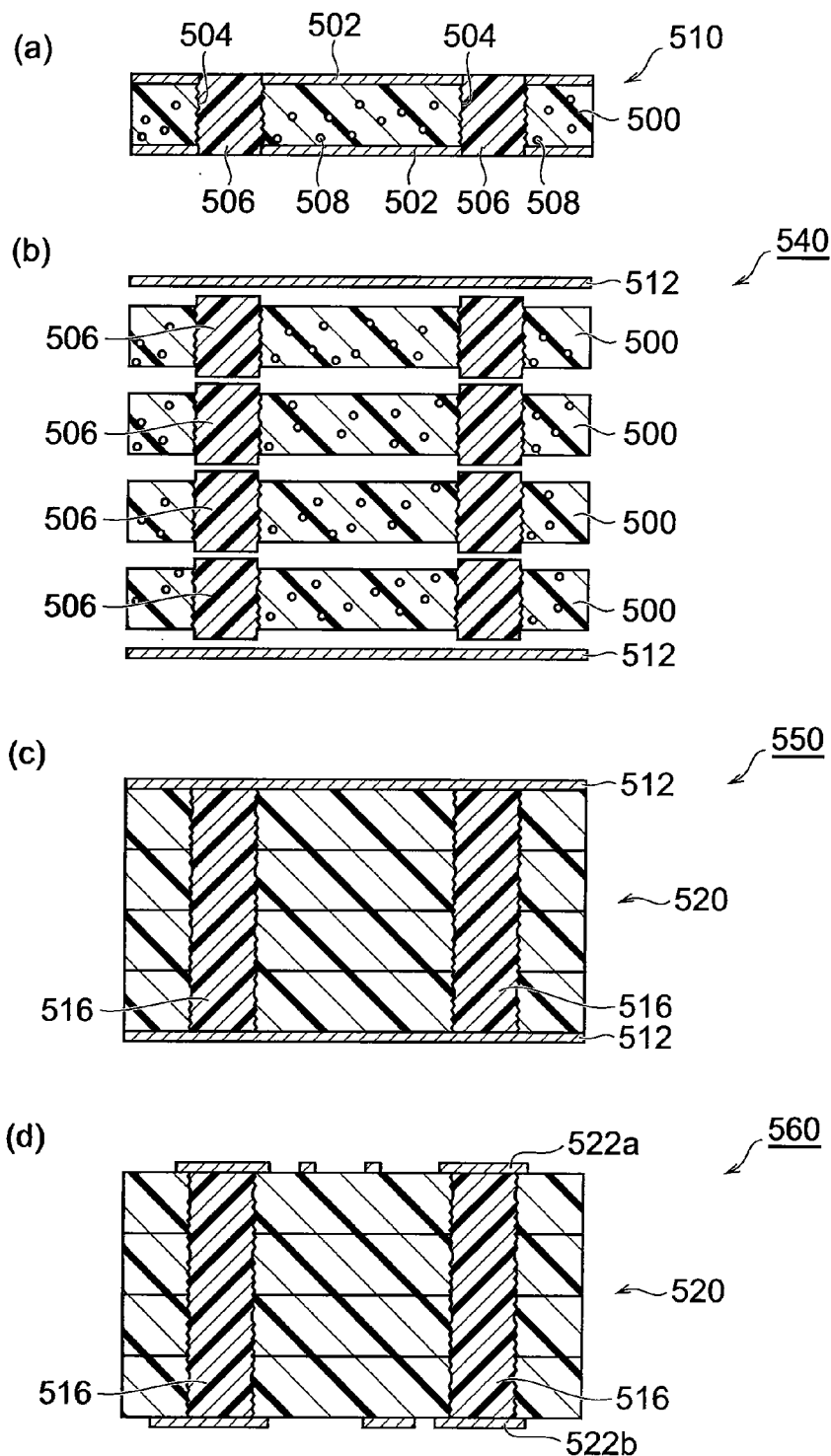
FIG. 5 is a cross-sectional process diagram showing production steps for a printed circuit board of a first embodiment.

First, the circuit board connection material 510 shown in FIG. 5(a) is prepared. The circuit board connection material 510 has a construction with a base material 500 comprising a releasable film 502 on both sides, and vias 506 composed of a conductive resin composition filling in the perforations 504 formed at prescribed locations of the base material 500. The circuit board connection material 510 having this construction may be the same as the circuit board connection material 410 described above.

Separately, a plurality of circuit board connection materials 510 (three shown here) having vias 506 formed at the same locations are prepared in the same manner described above. The releasable films 502 attached to the surfaces of the (four) prepared circuit board connection materials 510 are peeled off.

Next, as shown in FIG. 5(b), the four circuit board connection materials 510 from which the releasable films have been peeled off are aligned with reference pins and stacked. Copper foils 512 of approximately 35 μm thickness that have been roughened on one side are then stacked therewith on either side with the roughened surfaces facing inward. The result is a superposed body 540.

Next, as shown in FIG. 5(c), the obtained superposed body 540 is heated and pressed with, for example, a hot press in a vacuum for bonding of the circuit board connection materials 510 and copper foils 512 to obtain a laminated body 550. The heating and pressing harden the resin composition composing the circuit board connection material 510, and the conductive resin composition composing the vias 506. The laminated body 550 obtained in this manner comprises a base material 520 consisting of four bonded and cured circuit board connection materials 510, through-holes 516 running through the base material 520 which are formed by bonding and curing of the vias 506, and a pair of copper foils 512 bonded on both sides of the base material 520.

The copper foils 512 on both sides of the obtained laminated body 550 are then worked to the desired pattern to form conductor patterns (circuit patterns) 522a, 522b. This produces a double-sided circuit board 560 having the construction shown in FIG. 5(d). The method of forming the conductor patterns 522a, 522b may be a photolithography method, for example.

A photolithography method, specifically, involves first attaching a dry film onto the outer surface of the laminated body 550 (onto the surface opposite the base material 520) using a heated roll. Next, the dry film is exposed, through a mask, only at regions where the conductor patterns 522a, 522b are to be left, for curing of those regions. After then developing the uncured regions of the dry film, the copper foils 512 exposed after removal of the dry film are etched using, for example, a copper chloride solution. The dry film remaining on the surface is also removed. This forms conductor patterns 522a, 522b from the pair of copper foils 512.

Second Embodiment

Figure 6:
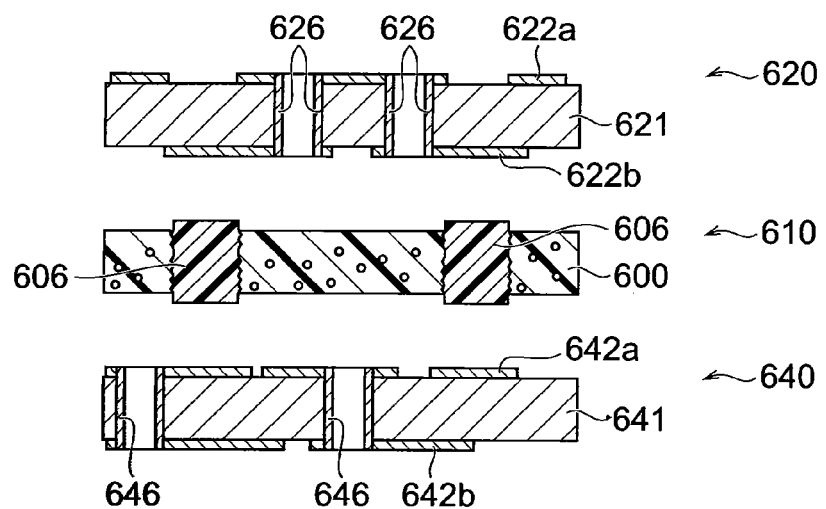
FIG. 6 is a schematic cross-sectional view showing production steps for a printed circuit board of a second embodiment.

A printed circuit board and a process for its production according to a second embodiment will now be explained. The printed circuit board of the second embodiment is a multilayer printed circuit board (multilayer circuit board) having a conductive layer on the outer and inner layers. FIG. 6 is a schematic cross-sectional view of production steps for a printed circuit board of the second embodiment.

For production of a multilayer printed circuit board according to this embodiment, a plurality (two shown here) of double-sided sheets (circuit boards) 620, 640 having conductor patterns formed on both sides of the board are prepared. A circuit board connection material 610 is also prepared for connection between them. The circuit board connection material 610 is composed of a base material 600 and vias 606. The circuit board connection material 610 may be one which is the circuit board connection material 410 of the embodiment described above with the releasable films 402 peeled off.

The double-sided sheet 620 has a construction comprising a base material 621, a conductor pattern 622a and conductor pattern 622b formed on either side thereof, and copper-plated through-holes 626 formed covering the inner walls of the perforations formed at prescribed locations. Similarly, the double-sided sheet 640 also comprises a base material 641, conductor patterns 642a, 642b and copper-plated through-holes 646.

The double-sided sheets 620, 640 can be obtained in the following manner, for example. Specifically, the roughened sided of a surface-roughened copper foil is first laid onto both sides of a base material such as a prepreg and then attached by heating and pressing with a hot press or the like in a vacuum. The prepreg used may be the prepreg 200 of the embodiment described above without perforations. Perforations are formed at prescribed locations of the resulting copper foil-attached base material by drilling or the like and the inner walls of the perforations are copper-plated to form copper-plated through-holes 626, 646.

Next, the copper foils on the copper foil-attached base material are worked by photolithography or the like to form conductor patterns 622a, 622b and 642a, 642b with the prescribed pattern shapes. This process yields double-sided sheets 620, 640 having the construction described above. The base material used for formation of the double-sided sheets may also be a plurality of stacked prepregs 200.

For production of a multilayer printed circuit board, the circuit board connection material 610 is then positioned in alignment between the double-sided sheet 620 and double-sided sheet 640, and superposed to obtain a superposed body. The obtained superposed body is heated and pressed with a hot press or the like in a vacuum for bonding of the layers to obtain a multilayer printed circuit board.

The multilayer printed circuit board obtained in this manner has a construction comprising four layers of conductor patterns (conductor patterns 622a, 622b, 642a and 642b) and insulating layers formed between the layers (on the base material 600 and base materials 621, 641, these are layers of the cured resin composition in the materials). Each insulating layer has copper-plated through-holes 626, 646 and vias 606 for electrical connection between the adjacent conductor patterns. In this second embodiment, the circuit board connection material 610 and at least one of the double-sided sheets 620, 640, preferably at least the circuit board connection material 610 and more preferably both, are formed from a prepreg according to the invention.

Third Embodiment

Figure 7:
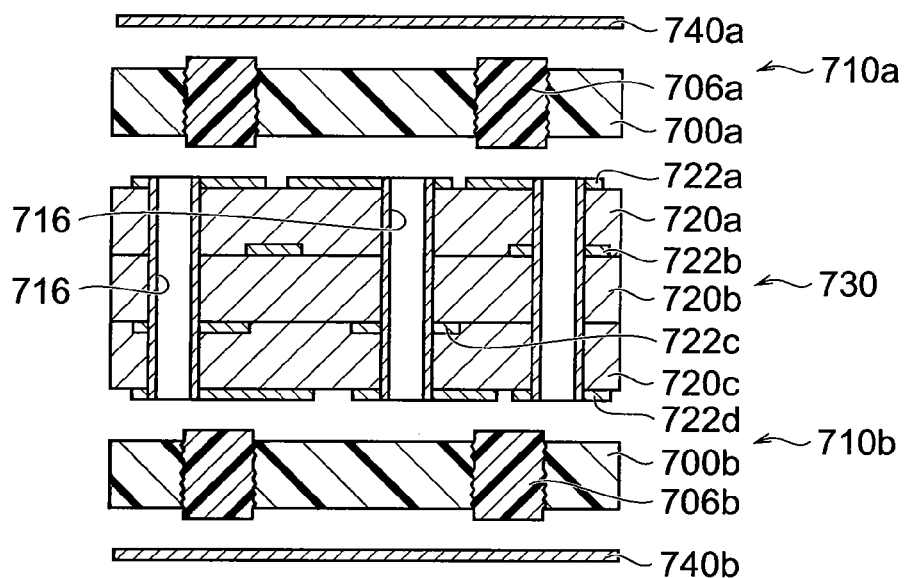
FIG. 7 is a cross-sectional process diagram showing production steps for a printed circuit board of a third embodiment.

A printed circuit board according to a third embodiment will now be explained. The printed circuit board of the third embodiment is a multilayer circuit board suitable for use as a multilayer printed circuit board. FIG. 7 is a cross-sectional process diagram showing production steps for a printed circuit board of a third embodiment.

For production of a multilayer printed circuit board according to this embodiment, there are prepared an inner layer circuit board 730 comprising conductor patterns on a plurality of layers (four shown here), a pair of copper foils 740a, 740b for formation of the conductor pattern on the outermost layer and two circuit board connection materials 710a, 710b for connection between them.

The circuit board connection materials 710a, 710b have a construction comprising base materials 700a, 700b and vias 706a, 706b made of a conductive resin composition filling in perforations formed at prescribed locations of the base materials 700a, 700b. The circuit board connection materials 710a, 710b may be in a form with the circuit board connection material 410 of the embodiment described above with the releasable films 402 peeled off.

The inner layer circuit board 730 has a laminated structure where the four layers of conductor patterns 722a, 722b, 722c, 722d are bonded through insulating layers 720a, 720b, 720c, and copper-plated through-holes 716 formed covering the inner walls of the perforations provided running through the laminated structure in the direction of thickness. The conductor patterns of the layers are electrically connected together by the copper-plated through-holes 716.

A inner layer circuit board 730 having the construction described above can be produced by the following process, for example. Specifically, the roughened sided of a surface-roughened copper foil is first laid on both sides of a base material such as a prepreg (for example, the prepreg 200 of the embodiment described above having no perforations formed therein) and then attached by heating and pressing with a hot press or the like in a vacuum. Next, the copper foils of the obtained copper foil-attached base material are worked by photolithography or the like to form conductor patterns 722b, 722c of the prescribed shapes, to obtain a double-sided sheet comprising conductor patterns on both sides of the base material. The base material used for formation of the double-sided sheets may also be a plurality of stacked prepregs 200.

Next, base materials such as prepregs and conductor foils such as a copper foils are positioned in that order on both surfaces of the obtained double-sided sheet and subjected to hot pressing or the like as described above for bonding to obtain a laminated body. After then forming perforations by drilling or the like at prescribed locations of the laminated body, the inner walls of the perforation are copper plated to form copper-plated through-holes 716. The copper foils on the sides of the outermost layers of the laminated body are worked by a method such as photolithography to form conductor patterns 722a, 722d with prescribed shapes. This produces an inner layer circuit board 730 having the construction described above.

For production of a multilayer printed circuit board according to this embodiment, the circuit board connection materials 710a, 710b are positioned and laid on both outer sides of the inner layer circuit board 730, and then the copper foils 740a, 740b are further situated and superposed over the outer sides with their roughened sides facing inward. The obtained superposed body is subjected to heating and pressing with a vacuum press or the like for bonding of the layers. The copper foils on the outermost layers of the pressed laminated body are worked by a method such as photolithography to form conductor patterns with the prescribed shapes. This produces a multilayer printed circuit board.

The multilayer printed circuit board obtained in this manner comprises six layers of conductor patterns (conductor patterns formed from the copper foils 740a, 740b and conductor patterns 722a-722d) and insulating layers formed between the patterns (for the boards 700a, 700b, 720a-720c, these are layers of the cured resin composition in the boards), and has a construction wherein each insulating layer comprises copper-plated through-holes 716 or vias 706a, 706b for electrical connection between the conductor patterns of each layer. In this third embodiment, the inner layer circuit board 730 and at least one of the circuit board connection materials 710a, 710b, preferably at least the circuit board connection materials 710a, 710b and more preferably both, are formed from a prepreg according to the invention.

Fourth Embodiment

Figure 8:
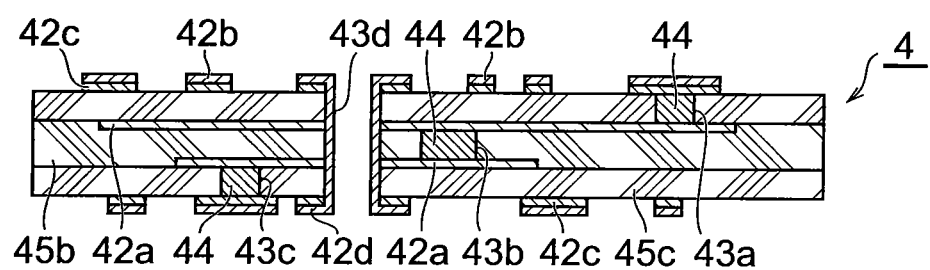
FIG. 8 is a schematic end view showing a printed circuit board of a fourth embodiment.
Figure 9:
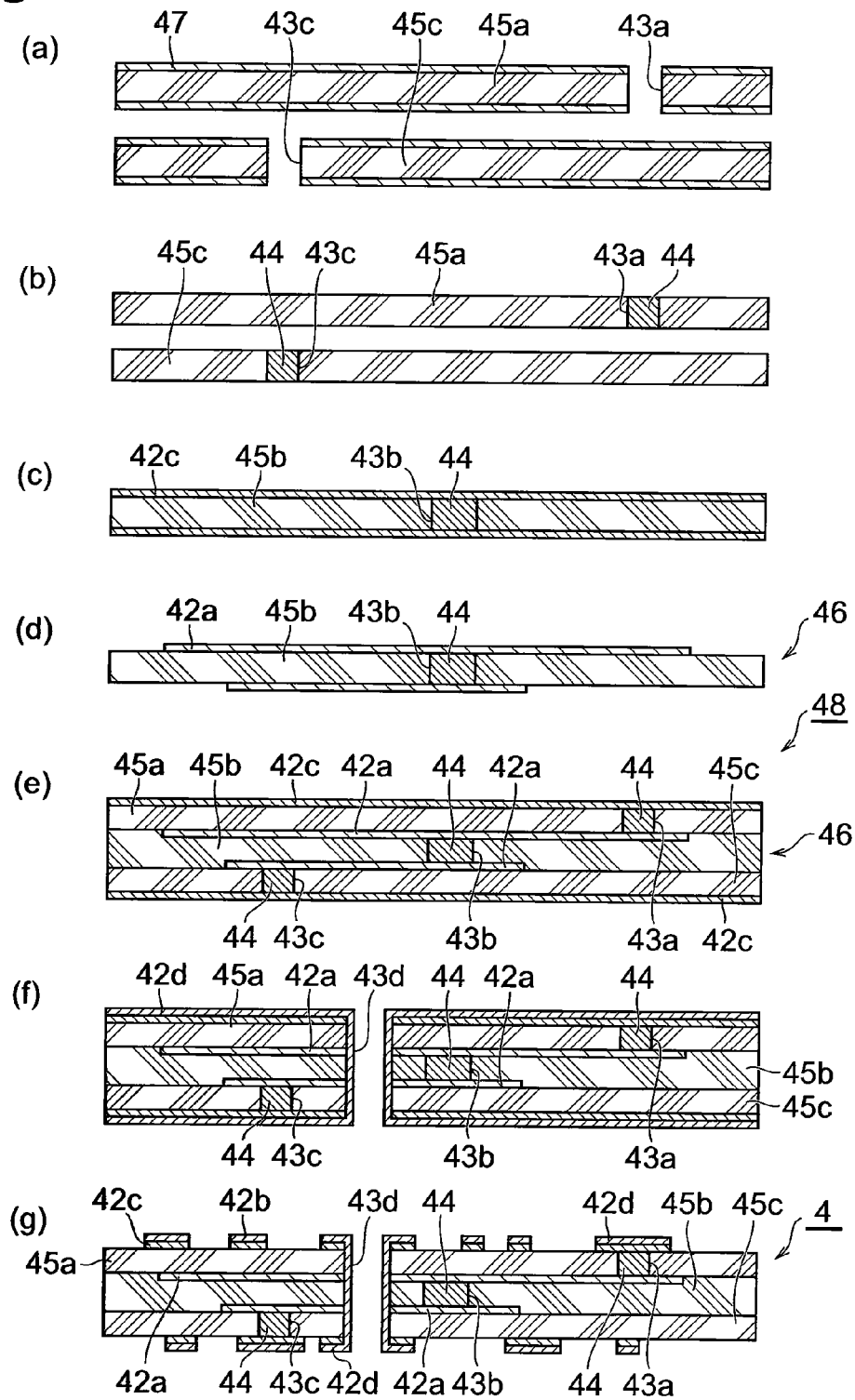
FIG. 9 is an end view showing production steps for a multilayer printed circuit board according to an embodiment of the invention.
Figure 10:
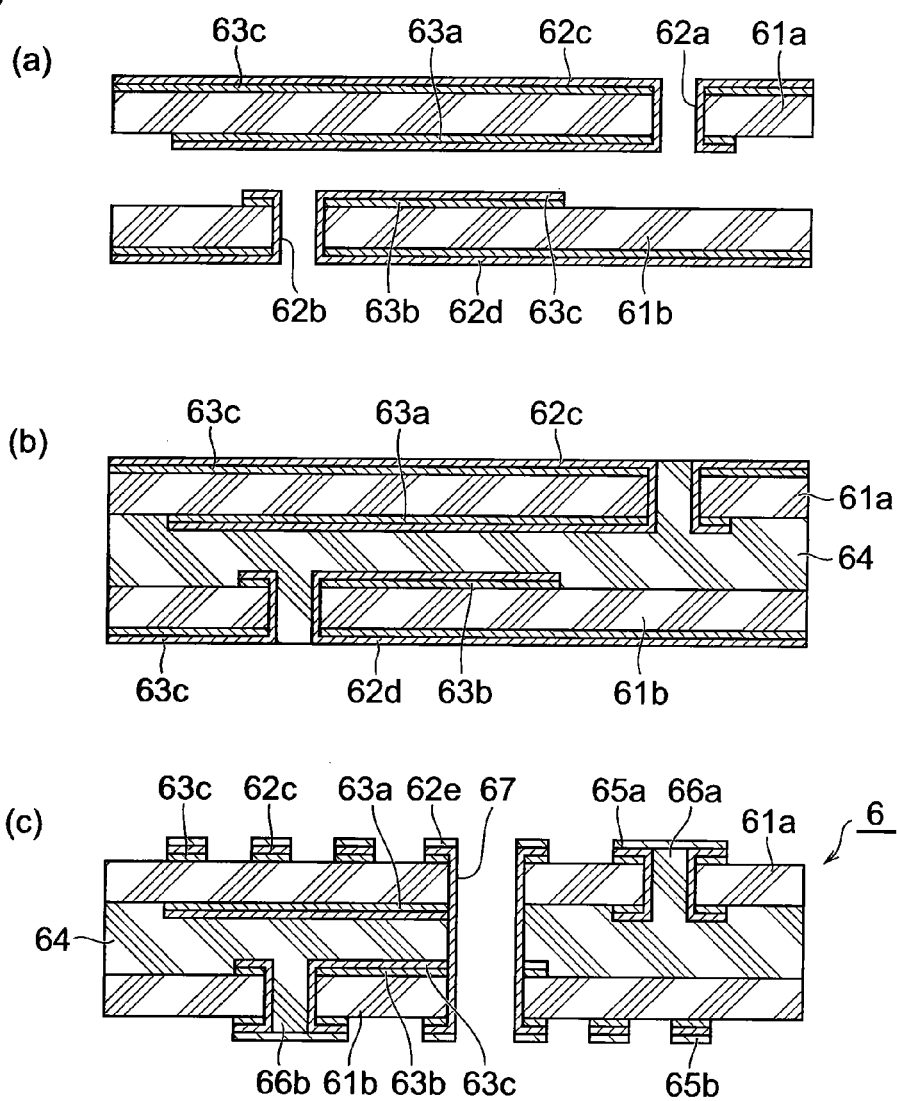
FIG. 10 is an end view showing the steps in a production process for a conventional multilayer printed circuit board.

A fourth embodiment of the printed circuit board will now be explained. The printed circuit board of the fourth embodiment is a multilayer printed circuit board. FIG. 8 is a schematic end view showing a printed circuit board of the fourth embodiment. FIG. 9 is an end view showing production steps for a printed circuit board according to the fourth embodiment.

Figure 4:
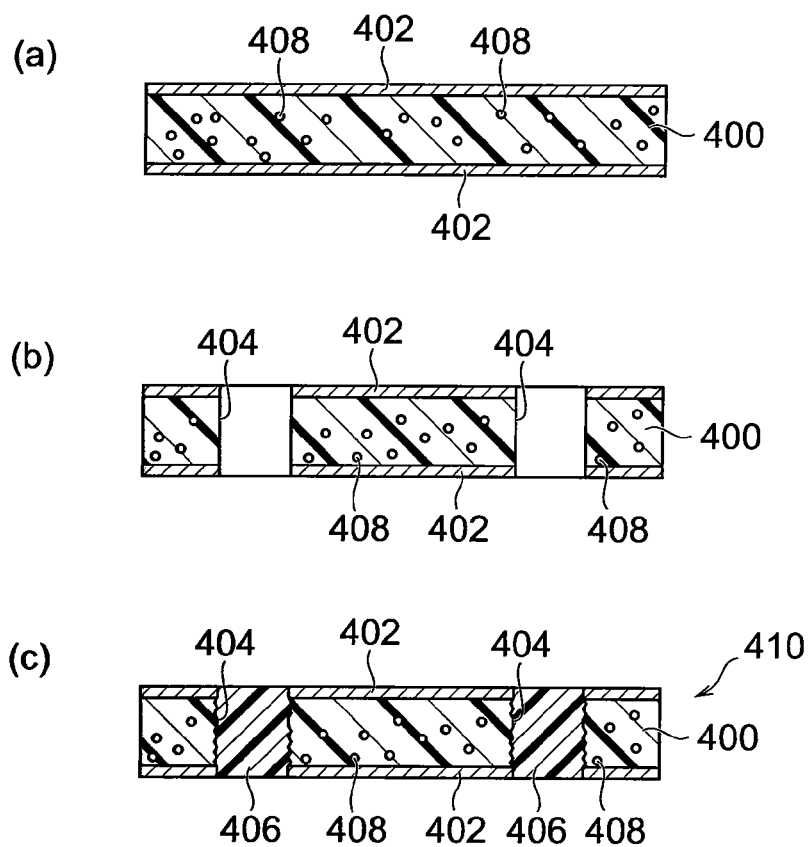
FIG. 4 is a cross-sectional process diagram showing production steps for a circuit board connection material.

In FIGS. 8 and 9, 4 is a multilayer printed circuit board, 42a is an inner layer conductor pattern, 42b is a outer layer conductor pattern, 42c is a copper foil, 42d is a conductive layer, 43a, 43b, 43c, 43d are perforations, 44 is a conductive paste, 45a, 45b, 45c are insulating sheets, 46 is an inner layer printed circuit board, 47 is a film, and 48 is a copper-clad multilayer insulating substrate.

This type of multilayer printed circuit board can be produced by the production process described below. First, there are prepared insulating sheets 45a, 45c obtained by semi-curing a prepreg or a prepreg laminate comprising a plurality of laminated prepregs. The prepreg used is preferably the prepreg 200 of the embodiment described above without perforations. Next, both sides of the prepreg or prepreg laminate are vacuum-laminated, as shown in FIG. 9(a), with films 47 composed of a polyester-based resin, for example, and then perforations (first perforations) 43a, 43c of a prescribed diameter are formed using means such as an NC drill machine and drill or carbon dioxide gas, or a laser light beam from an excimer laser or the like.

Next, a screen printing method or the like is used fill or coat the perforations 43a, 43c formed in the insulating sheets 45a, 45c and films 47 with a conductive paste 44 composed of, for example, copper particles and an epoxy-based resin or the like. The films 47 are then peeled off as shown in FIG. 9(b) to form outer layer insulating sheets 45a, 45c.

First, films are vacuum-laminated on both sides of an insulating sheet 45b obtained by semi-curing a prepreg or a prepreg laminate comprising a plurality of laminated prepregs, and then perforations (second perforations) 43b with a prescribed diameter are formed. The prepreg used is preferably the prepreg 200 of the embodiment described above without perforations. After filling or coating the perforations 43b with the conductive paste 44, the films are peeled off to form an inner layer insulating sheet 45b.

Next, a hot press or the like is used to laminate both sides of the inner layer insulating sheet 45b with copper foils 42c each having a thickness of about 35 µm, as shown in FIG. 9(c). An etching resist is then formed on the surfaces of the laminated copper foils 42c by screen printing or photographic development. Next, the exposed sections of the copper foils 42c where no etching resist has been formed are removed by etching with a solution such as cupric chloride, and the etching resist is then released. The result is an inner layer printed circuit board 46 having an inner layer conductor pattern 42a formed on both surfaces of the inner layer insulating sheet 45b, as shown in FIG. 9(d).

Next there are combined in order a copper foil 42c with a thickness of about 18 µm, an outer layer insulating sheet 45a having conductive paste 44 filling or coating the perforations 43a, an inner layer printed circuit board 46, an outer layer insulating sheet 45c having conductive paste 44 filling or coating the perforations 43c and a copper foil 42c with a thickness of 18 µm. These are laminated while heating and pressing with a vacuum hot press machine at a pressure of about 2–4×10$^4$ Pa and a temperature of 150-180° C. The lamination is carried out in such a manner that the compressibility ratio of the outer layer insulating sheet 45a, the inner layer printed circuit board 46 and the outer layer insulating sheet 45c by the heat and pressure is 0-10%. This forms a copper-clad multilayer insulating substrate 48 as shown in FIG. 9(e).

Next, perforations (third through-holes) 43d with a prescribed diameter are formed at prescribed locations of the laminated copper-clad multilayer insulating substrate 48 using means such as a NC drill machine and drill. Subsequent electroless or electrolytic copper plating forms a conductive layer 42d on the inner wall surfaces of the perforations 43d and the surface of the copper foil 42c, as shown in FIG. 9(f).

An etching resist is then formed on the surface of the conductive layer 42d of the copper-clad multilayer insulating substrate 48 by screen printing, photographic development or the like. Next, the exposed conductive layer 42d and sections of the copper foil 42c where no etching resist has been formed are removed by etching with a solution such as cupric chloride, and the etching resist is then released. Thus is obtained a multilayer printed circuit board 4 comprising an inner layer conductor pattern 42a formed in an insulating substrate laminated with insulating sheets 45a, 45b, 45c, conductive paste 44 filling or coating the perforations 43a, 43b, 43c, a conductive layer 42d formed on the walls of the perforations 43d and an outer layer conductor pattern 42b formed on the insulating substrate surface, as shown in FIG. 9(g) and FIG. 8.

When the production process for a multilayer printed circuit board of this embodiment is compared with a conventional multilayer printed circuit board production process, it will be appreciated that component holes structured in the same manner as IVH, and outer layer conductor patterns, can be formed by a single copper plating treatment instead of the conventional two treatments. As a result, the formation time for outer layer conductor patterns by etching can be shortened by about ⅔. Furthermore, variation in the finished outer layer conductor pattern width is reduced to about 0.05-0.03 mm from the conventional 0.07 mm.

According to this embodiment, therefore, it is possible to reduce the number of copper plating treatments required for formation of IVH or through-holes by conventional processes and to form high precision outer layer conductor patterns.

Incidentally, although the inner layer conductor pattern was formed after forming perforations in the inner layer insulating sheet and filling or coating them with the conductive paste for this embodiment, a reverse method may be employed wherein the film is bonded to the inner layer insulating sheet having the inner layer conductor pattern formed thereon and perforations are formed therein, after which the perforations are filled or coated with the conductive paste. Either of these methods maybe selected depending on convenience.

Also, the multilayer printed circuit board was formed by lamination after formation of the inner layer printed circuit board for this embodiment, but a different method may be employed wherein, as shown in FIG. 9(c), the copper foil is formed on both sides of the insulating sheet, only one side thereof is etched to form the conductor pattern, and it is used as an outer layer printed circuit board. Alternatively, an insulating sheet without formation of the pattern shown in FIG. 9(b) may be used as the inner layer insulating sheet for lamination, to form a multilayer printed circuit board in the same manner. That is, this method allows the insulating sheet to be sandwiched and contact bonded with a pair of the aforementioned outer layer printed circuit boards to produce a multilayer printed circuit board. The outer layer printed circuit boards in this case are laminated with their conductor patterns facing outward.

According to this embodiment, the circuit board connection material 510 described above may be used for the outer layer insulating sheets 45a, 45c. This will permit satisfactory connection between the inner layer conductor pattern 42a and outer layer conductor pattern 42b even when they are intricate patterns.

In addition, the conductive paste 44 of this embodiment was a copper paste composed of copper particles and an epoxy-based resin, but the conductive paste 44 may also contain metal powder such as gold, silver, tin, lead or the like. The copper foils 42c used had thicknesses of 35 µm and 18 µm, but the thicknesses of the copper foils 42c are not limited to these.

EXAMPLES

The present invention will now be further explained by examples, with the understanding that the invention is not necessarily limited by the examples.

The methods of measuring the weight-average molecular weight and epoxy value of the acrylic-based polymers used in the examples and comparative examples below, and the method of measuring the 20° C. storage elastic modulus of the cured resin composition, will be explained first.

(Method of Measuring Weight-Average Molecular Weight of Acrylic-Based Polymer)

The weight-average molecular weight of the acrylic-based polymer was determined by measuring the acrylic-based polymer by gel permeation chromatography (GPC) under the conditions described below, and calculating from a calibration curve obtained for standard polystyrene.

GPC Conditions:
Detector: HLC-8120GPC [Tosoh Corp.] Column: $GMH_{XL}$ equivalent
(3 columns)(trade name: "TSKgel G5000H" by Tosoh Corp.)
Column size: 7.5 mm$\phi$×300 mm
Eluent: THF
Sample concentration: 5 mg/1 mL
Injection rate: 50 µL
Pressure: 50 kgf/cm$^2$
Flow rate: 1.0 mL/min (Measurement of Epoxy Value of Acrylic-Based Polymer)

The epoxy value of the acrylic-based polymer was determined by the following procedure.

1) A 2.5 g portion of the sample (acrylic-based polymer) was weighed out into a stoppered 100 ml Erlenmeyer flask.
2) Approximately 20 ml of methyl ethyl ketone (MEK) was added and the sample was stirred to dissolution for about 5 minutes.
3) After then adding 10 ml of an N/10 HCl-dioxane solution with a whole pipette, the flask was stopped and gently shaken for mixing. Upon confirming transparency and homogeneity, it was allowed to stand for 10 minutes.
4) Approximately 4 ml of ethanol was added, five drops of phenolphthalein indicator was added and titration was performed with a $\frac{1}{10}$ KOH ethanol solution. The end point was defined as the point of light pink coloration.
5) A separately prepared blank was also titrated in the same manner (blank test).
6) The epoxy value was calculated by the following formula.

$$\text{Epoxy value (eq/100 g)} = (f \times (B-T))/(W \times c)$$

In this formula, f represents the factor of the $\frac{1}{10}$ KOH ethanol solution, B represents the titer (ml) of the blank test, T represents the titer (ml) of the sample, W represents the weight (g) of the sample and c represents the concentration (wt %) of the sample.

The N/10 HCl dioxane solution was prepared by transferring 1 ml of concentrated hydrochloric acid with a measuring pipette and 100 ml of dioxane with a graduated cylinder into a stoppered 200 ml Erlenmeyer flask, stopping the flask and gently shaking for mixing.

(Method of Measuring 20° C. Storage Elastic Modulus of Cured Resin Composition)

The 20° C. storage elastic modulus of the cured resin composition was determined by the following procedure. Specifically, a varnish containing the resin composition was first coated onto a 12 µm-thick electrolytic copper foil (trade name: "F2-WS-12" by Furukawa Electric Co., Ltd.) to a coated film thickness of about 50-100 µm, and heated at 180° C. for 60 minutes. Next, the cured resin obtained by removal of the copper foil by etching was cut to a size of about 30 mm×5 mm and used as a sample for storage elastic modulus measurement. The measurement sample was measured using a "Reogel-E-4000" dynamic viscoelasticity measuring apparatus (product of UBM) under conditions with a measuring length of 20 mm and a measuring frequency of 10 Hz, to obtain a dynamic viscoelasticity curve. The 20° C. elastic modulus on the obtained dynamic viscoelasticity curve was used as the storage elastic modulus.

Example 1

A multilayer printed circuit board for Example 1 was fabricated by the method described below. The multilayer printed circuit board for Example 1 was produced by essentially the same steps as in the production process for the printed circuit board of the third embodiment described above (FIG. 7), except that the inner layer printed circuit board (inner layer circuit board) used had only a layer composed of a single-layer prepreg.

(Fabrication of Composite and Prepreg)

First, a resin composition containing the following components, having a 20° C. storage elastic modulus of 700 MPa when cured by heat treatment at 180° C., 60 minutes, was dissolved in the organic solvent methyl ethyl ketone, and the viscosity was adjusted to 700 cP to prepare a varnish (resin solid content: 30 wt %).

Resin Composition Components
Acrylic resin composition "HTR-860P3" (product of Nagase ChemteX Corp., weight-average molecular weight: approximately 850,000, epoxy value: 3): 100 parts by weight,
Epoxy resin "EPIKOTE-828" (product of Japan Epoxy Resins Co., Ltd.): 60 parts by weight,
Novolac-type phenol resin "Novolac-phenol VP6371" (product of Hitachi Chemical Co., Ltd.): 40 parts by weight,
Curing agent "Imidazole 2PZ-CN" (product of Shikoku Chemicals Corp.): 0.4 part by weight.

Next, a dip coating machine was used for impregnation of the obtained varnish into a 0.04 mm-thick glass cloth (Glass Cloth #1037, product of Nittobo Co., Ltd.) to a varnish solid volume/glass cloth volume ratio of 0.6 to obtain a composite.

The composite was then hot-air dried at 150° C. for 5 minutes to produce a prepreg with a resin composition curing ratio of 30%.

(Fabrication of Inner Layer Printed Circuit Board)

Releasable films made of polyethylene terephthalate (16 µm thickness) were formed on both sides of the obtained prepreg. Perforations with a diameter of 200 µm were then formed at prescribed locations of the prepreg using a laser beam machine. Using the laser beam machine allowed easy and rapid formation of perforations with fine diameters.

After then filling in the perforations with conductive paste, the surface releasable films were peeled off. The conductive paste was obtained by mixing a solventless epoxy resin as the binder resin with copper powder having a mean particle size of 2 µm as the conductive material, at a proportion of 90 wt %, and uniformly kneading the mixture with a triple roll kneader. The conductive paste was filled into the perforations by print coating using a squeegee method from the top of the releasable film. The releasable films function as a printing mask, thus preventing contamination of the prepreg surface by the conductive paste.

Next, 35 µm-thick copper foils were situated on both sides of the prepreg and heated in a vacuum while applying a pressure of 60 kg/cm$^2$. The temperature history was temperature increase from room temperature to 200° C. over a period of 30 minutes, holding at 200° C. for 60 minutes and then temperature decrease from 200° C. to room temperature over a period of 30 minutes. The heating and pressing caused curing of the prepreg to form an insulating substrate, converting the conductive paste to an electric conductor while bonding the copper foils onto both sides of the insulating substrate. This established electrical connection of both copper foils through the electric conductor in the perforations.

Next, the copper foils were patterned by photolithography to form conductor patterns on both sides of the insulating substrate, thus producing an inner layer printed circuit board bearing inner layer conductor patterns on both sides.

(Fabrication of Circuit Board Connection Material)

First, a heat resistant organic sheet was prepared and releasable films made of polyethylene terephthalate (16 µm thickness) were attached to both sides thereof. Perforations with a pore size of 200 µm were then formed at prescribed locations of the heat resistant organic sheet using a laser beam machine. The heat resistant organic sheet used was one obtained by coating a rubber-modified epoxy resin adhesive to a thickness of 10 µm on both sides of a total aromatic polyamide resin sheet (trade name "ARAMICA" by Asahi Kasei Corp., thickness: 30 µm), in order to strengthen the adhesive force against the conductor pattern and other layers of the inner layer printed circuit board during production of the multilayer printed circuit board described hereunder. When the heat resistant organic sheet is, for example, a heat sealing-polyimide sheet which exhibits high adhesive force simply by heating and pressing the conductor pattern, coating of such an adhesive is not necessary.

After then filling the perforations of the heat resistant organic sheet with a conductive paste having a suitable viscosity and flow property, the releasable films were peeled off to obtain a circuit board connection material. For this example, two such circuit board connection materials were prepared.

(Fabrication of Multilayer Printed Circuit Board)

The circuit board connection material was situated on either side of the inner layer printed circuit board described above, and a 35 µm-thick copper foil was situated on both outer sides thereof to obtain a superposed body. The superposed body was subject to temperature increase from room temperature to 200° C. over a period of 30 minutes while applying a pressure of 60 kg/cm$^2$ in a vacuum in the direction of lamination, and then held at 200° C. for 60 minutes and lowered in temperature to room temperature over a period of 30 minutes. This accomplished bonding between the inner layer printed circuit board and circuit board connection materials while also bonding the circuit board connection materials and copper foils.

The copper foils on the outermost layer surfaces were then patterned by photolithography to form outer layer conductor patterns, thus obtaining a multilayer printed circuit board for Example 1 having a total of four conductor patterns including a pair of inner layer conductor patterns and a pair of outer layer conductor patterns.

Example 2

A multilayer printed circuit board for Example 2 was fabricated by the method described below. The multilayer printed circuit board for Example 2 was produced by essentially the same steps as the process for production of a printed circuit board according to the second embodiment described above (FIG. 6).

(Fabrication of Circuit Board Connection Material)

First, releasable films made of polyethylene terephthalate or the like were formed on both sides of a prepreg obtained in the same manner as Example 1. Perforations with a pore size of 200 µm were then formed at prescribed locations of the prepreg using a laser beam machine. After then filling in the perforations with conductive paste, the releasable films were peeled off to obtain a circuit board connection material.

(Fabrication of Outer Layer Printed Circuit Board (Double-Sided Sheet))

First, a heat resistant organic sheet was prepared and releasable films made of polyethylene terephthalate (16 µm thickness) were attached to both sides thereof. Perforations with a diameter of 200 µm were then formed at prescribed locations of the heat resistant organic sheet using a laser beam machine. After then filling the perforations with a conductive paste having a suitable viscosity and flow property, the releasable films were peeled off.

Next, 35 µm-thick copper foils were situated on both sides of the heat resistant organic sheet, and the temperature was raised from room temperature to 200° C. over a period of 30 minutes, held at 200° C. for 60 minutes and lowered to room temperature over a period of 30 minutes, in a vacuum while applying a pressure of 60 kg/cm$^2$, for compression and curing of the heat resistant organic sheet and conductive paste while bonding the copper foils onto both sides of the heat resistant organic sheet. This produced a double-sided copper clad laminate having both copper foils electrically connected through the electric conductor in the perforations.

The copper foils of the double-sided copper clad laminate were then patterned by photolithography to form conductor patterns, thus yielding an outer layer printed circuit board (double-sided sheet) comprising a conductor pattern on both sides of an insulating substrate formed from a heat resistant organic sheet. In this outer layer printed circuit board, the conductor pattern formed on one side of the insulating substrate is the outer layer conductor pattern, while the conductor pattern formed on the other side is the inner layer conductor pattern. For this example, two such outer layer printed circuit boards were prepared.

(Fabrication of Multilayer Printed Circuit Board)

First, the aforementioned circuit board connection material was situated between the two outer layer printed circuit boards obtained in the manner described above to obtain a superposed body. The pair of outer layer printed circuit boards were situated opposite each other with their inner layer conductor patterns facing inward. Next, the obtained superposed body was heated while pressing in the direction of lamination, and the circuit board connection material in a prepreg state and the conductive paste contained therein were compressed and cured. This produced a multilayer printed circuit board for Example 2 comprising a total of four layers of conductor patterns including the pairs of outer layer conductor patterns and inner layer conductor patterns.

Example 3

A multilayer printed circuit board for Example 3 was fabricated by the method described below. The multilayer printed circuit board for Example 3 was obtained by forming the outer layer conductor pattern by a transfer method instead of photolithography in the process for production of the printed circuit board of Example 1 described above.

(Fabrication of Multilayer Printed Circuit Board)

First, an inner layer printed circuit board and circuit board connection materials were fabricated in the same manner as Example 1.

The circuit board connection materials were then situated on either side of the previously obtained inner layer printed circuit board. Next, two transfer films prepared beforehand were situated on both outer sides of the circuit board connection materials to obtain a superposed body. The transfer films comprised prescribed conductor patterns formed on releasable conductor support sheets, and were positioned with the conductor patterns facing the circuit board connection materials.

The superposed body was then pressed in the direction of lamination while heating, to compress and cure the conductive paste filled into the perforations of the circuit board connection materials while bonding the inner layer printed circuit board and circuit board connection material and the circuit board connection material and the conductor pattern of the transfer film. These were bonded by an adhesive on the surfaces of the circuit board connection materials.

Upon completion of the compression and curing reaction, the releasable conductor support sheet of the transfer film was released. This produced a multilayer printed circuit board for Example 3 comprising a total of four layers of conductor patterns including a pair of inner layer conductor patterns on the inner layer printed circuit board and a pair of outer layer conductor patterns transferred from the transfer film.

Example 4

A multilayer printed circuit board for Example 4 was fabricated in the same manner as Example 1, except that the varnish described below was used to prepare the composite and prepreg. The varnish was heat treated at 180° C. for 60 minutes to obtain a resin composition containing the components listed below and having a cured 20° C. storage elastic modulus of 300 MPa, and the composition was dissolved in the organic solvent methyl ethyl ketone and adjusted to a viscosity of 500 cP (resin solid content: 25 wt %) for use.
Resin Composition Components:
Acrylic resin composition "HTR-860P3" (product of Nagase ChemteX Corp., weight-average molecular weight: approximately 850,000, epoxy value: 3): 250 parts by weight,
Epoxy resin "EPIKOTE-828" (product of Japan Epoxy Resins Co., Ltd.): 40 parts by weight,
Novolac-type phenol resin "Novolac-phenol VP6371" (product of Hitachi Chemical Co., Ltd.): 40 parts by weight,
Curing agent "Imidazole 2PZ-CN" (product of Shikoku Chemicals Corp.): 0.4 part by weight.

Example 5

A multilayer printed circuit board for Example 5 was fabricated in the same manner as Example 1, except that the varnish described below was used to prepare the composite and prepreg. The varnish was heat treated at 180° C. for 60 minutes to obtain a resin composition containing the components listed below and having a cured 20° C. storage elastic modulus of 1900 MPa, and the composition was dissolved in the organic solvent methyl ethyl ketone and adjusted to a viscosity of 1000 cP (resin solid content: 50 wt %) for use.
Resin Composition Components:
Acrylic resin composition "HTR-860P3" (product of Nagase ChemteX Corp., weight-average molecular weight: approximately 850,000, epoxy value: 3): 20 parts by weight,
Epoxy resin "EPIKOTE-828" (product of Japan Epoxy Resins Co., Ltd.): 40 parts by weight,
Novolac-type phenol resin "Novolac-phenol VP6371" (product of Hitachi Chemical Co., Ltd.): 40 parts by weight,
Curing agent "Imidazole 2PZ-CN" (product of Shikoku Chemicals Corp.): 0.4 part by weight.

Example 6

A multilayer printed circuit board for Example 6 was fabricated in the same manner as Example 1, except that the varnish described below was used to prepare the composite and prepreg. The varnish was heat treated at 180° C. for 60 minutes to obtain a resin composition containing the components listed below and having a cured 20° C. storage elastic modulus of 150 MPa, and the composition was dissolved in the organic solvent methyl ethyl ketone and adjusted to a viscosity of 700 cP (resin solid content: 30 wt %) for use.
Resin Composition Components:
Acrylic resin composition "HTR-860P3" (product of Nagase ChemteX Corp., weight-average molecular weight: approximately 850,000, epoxy value: 3): 350 parts by weight,
Epoxy resin "EPIKOTE-828" (product of Japan Epoxy Resins Co., Ltd.): 40 parts by weight,
Novolac-type phenol resin "Novolac-phenol VP6371" (product of Hitachi Chemical Co., Ltd.): 40 parts by weight,
Curing agent "Imidazole 2PZ-CN" (product of Shikoku Chemicals Corp.): 0.4 part by weight.

Comparative Example 1

A multilayer printed circuit board for Comparative Example 1 was fabricated in the same manner as Example 1, except that the varnish described below was used to prepare the composite and prepreg. The varnish was heat treated at 180° C. for 60 minutes to obtain a resin composition containing the components listed below and having a cured 20° C. storage elastic modulus of 3500 MPa, and the composition was dissolved in the organic solvent methyl ethyl ketone/propylene glycol monomethyl ether (weight ratio: 80/20) and adjusted to a viscosity of 300 cP (resin solid content: 70 wt %) for use.
Resin Composition Components:
Brominated bisphenol A-type epoxy resin (trade name: "EPIKOTE 5046" by Japan Epoxy Resins Co., Ltd., epoxy equivalents: 530): 100 parts by weight,
Epoxy resin "EPIKOTE-828" (product of Japan Epoxy Resins Co., Ltd.): 40 parts by weight,
Dicyandiamide: 4 parts by weight,
Curing agent "Imidazole 2E4 MZ" (product of Shikoku Chemicals Corp.): 0.5 part by weight.

Comparative Example 2

A multilayer printed circuit board for Comparative Example 2 was fabricated in the same manner as Example 1, except that the varnish described below was used to prepare the composite and prepreg. The varnish was heat treated at 180° C. for 60 minutes to obtain a resin composition containing the components listed below and having a cured 20° C. storage elastic modulus of 2100 MPa, and the composition was dissolved in the organic solvent methyl ethyl ketone and adjusted to a viscosity of 400 cP (resin solid content: 30 wt %) for use.
Resin Composition Components:
Acrylic resin composition (weight-average molecular weight: approximately 20,000): 80 parts by weight,
Epoxy resin "EPIKOTE-828" (product of Japan Epoxy Resins Co., Ltd.): 40 parts by weight,
Novolac-type phenol resin "Novolac-phenol VP6371" (product of Hitachi Chemical Co., Ltd.): 40 parts by weight,
Curing agent "Imidazole 2PZ-CN" (product of Shikoku Chemicals Corp.): 0.4 part by weight.

Comparative Example 3

A multilayer printed circuit board for Comparative Example 3 was fabricated in the same manner as Example 1, except that the varnish described below was used to prepare the composite and prepreg. The varnish was heat treated at 180° C. for 60 minutes to obtain a resin composition containing the components listed below and having a cured 20° C. storage elastic modulus of 80 MPa, and the composition was dissolved in the organic solvent methyl ethyl ketone and adjusted to a viscosity of 700 cP (resin solid content: 30 wt %) for use.

Resin Composition Components:
Acrylic resin composition "HTR-860P3" (product of Nagase ChemteX Corp., weight-average molecular weight: approximately 850,000, epoxy value: 3): 500 parts by weight,
Epoxy resin "EPIKOTE-828" (product of Japan Epoxy Resins Co., Ltd.): 40 parts by weight,
Novolac-type phenol resin "Novolac-phenol VP6371" (product of Hitachi Chemical Co., Ltd.): 40 parts by weight,
Curing agent "Imidazole 2PZ-CN" (product of Shikoku Chemicals Corp.): 0.4 part by weight.

Comparative Example 4

A multilayer printed circuit board was fabricated in the same manner as Example 1, except that a 80 μm-thick polyimide film was used instead of the prepreg in Example 1.

[Evaluation of Physical Properties]

(90° Bending Performance)

The multilayer printed circuit boards of Examples 1-6 and Comparative Examples 1-4 were each used for 90° bending performance evaluation by the following method. The results are shown in Table 1. The multilayer printed circuit boards of Examples 1-6 and Comparative Examples 1-4 all had the same number of perforations, locations of perforations and conductor pattern shapes.

Specifically, the multilayer printed circuit board was first cut into a size of 10 mm width×100 mm length to prepare a sample for the 90° bending test. Next, a 5 mm-thick aluminum plate was contacted vertically with the sample and the sample was bent 90° along the section of contact with the aluminum plate. The bent sample was visually observed and the conduction electrical resistance of the conductor pattern in the sample was measured. Samples that exhibited no cracking or breakage at the bent section were judged to be able to withstand 90° bending and were evaluated as "OK", while samples that exhibited cracking or breakage, or that had infinite conduction electrical resistance were judged to have broken due to 90° bending and were evaluated as "NG".

(Heat Resistance)

The multilayer printed circuit boards of Examples 1-6 and Comparative Examples 1-4 were cut to 50 mm×50 mm sizes to prepare samples for a heat resistance test. Each of the samples was floated on 288° C. molten solder and the state of the sample was visually observed. Samples that exhibited no swelling or peeling after 5 minutes of floating on solder were evaluated as "OK", while samples that exhibited swelling or peeling during the 5 minutes of floating on solder were evaluated as "NG". The results are shown in Table 1.

TABLE 1

|  | 90° bending performance | Heat resistance |
|---|---|---|
| Example 1 | OK | OK |
| Example 2 | OK | OK |
| Example 3 | OK | OK |
| Example 4 | OK | OK |
| Example 5 | OK | OK |
| Example 6 | OK | OK |

TABLE 1-continued

|  | 90° bending performance | Heat resistance |
|---|---|---|
| Comp. Ex. 1 | NG | NG |
| Comp. Ex. 2 | NG | NG |
| Comp. Ex. 3 | OK | NG |
| Comp. Ex. 4 | OK | OK |

(Dimensional Change)

The dimensional change produced when fabricating the multilayer printed circuit boards of Example 1 and Comparative Example 4 was measured by the following method. Specifically, during production of the multilayer printed circuit board of Example 1 or Comparative Example 4, two perforations for dimensional change measurement (a reference point and a measuring point) were formed in the prepreg (Example 1) or polyimide film (Comparative Example 4) during production of the inner layer printed circuit boards. The coordinate positions of the reference point and measuring point were measured at two time points: (i) when the conductive paste was filled into the perforations and (ii) immediately after bonding of the copper foil during subsequent fabrication of the inner layer printed circuit boards. The coordinate positions were measured at room temperature using a QV three-dimensional size measuring device by Mitsutoyo Corp.

Based on the coordinate positions measured in this manner, the distance from the reference point to the measuring point at the time of formation of the measurement perforations (initial value) and the distance (observed value) from the reference point to the measuring point at each of the time points (i) and (ii) were calculated. The obtained values were inserted into the following formula (I) to determine the rate of dimensional change (%) at time points (i) and (ii) with respect to the time when the perforations were formed.

Rate of dimensional change (%)=100×(observed value at each time point−initial value)/(initial value)    (1)

The results are shown in Table 2. These measurements were conducted at six locations in both the longitudinal direction and transverse direction of the prepreg or polyamideimide. Table 2 shows the maximum values, minimum values and mean values obtained by measurement in each direction.

TABLE 2

|  |  |  |  | Example 1 | Comp. Ex. 4 |
|---|---|---|---|---|---|
| Dimensional change | Longitudinal direction | (i) | Maximum | 0.011 | 0.038 |
|  |  |  | Minimum | 0.006 | 0.011 |
|  |  |  | Mean | 0.009 | 0.027 |
|  |  | (ii) | Maximum | −0.065 | −0.620 |
|  |  |  | Minimum | −0.056 | −0.501 |
|  |  |  | Mean | −0.060 | −0.548 |
|  | Transverse direction | (i) | Maximum | 0.013 | 0.040 |
|  |  |  | Minimum | 0.007 | 0.018 |
|  |  |  | Mean | 0.010 | 0.029 |
|  |  | (ii) | Maximum | −0.056 | −0.449 |
|  |  |  | Minimum | −0.048 | −0.333 |
|  |  |  | Mean | −0.052 | −0.399 |

Table 1 confirmed that the multilayer printed circuit boards of Examples 1-6 exhibited sufficient bending performance and had no swelling or peeling due to flaking of resin dust or fibers even in the heat resistance test. In contrast, the multilayer printed circuit boards of Comparative Examples 1-3 exhibited swelling and peeling due to flaking of resin dust or fibers in the heat resistance test. In particular, the multilayer printed circuit boards of Comparative Examples 1 and 2 which employed resin compositions with a storage elastic modulus of greater than 2000 MPa clearly had insufficient bending performance.

The multilayer printed circuit board of Comparative Example 4 had adequate bending performance and heat resistance, but as shown in Table 2, its rate of dimensional change was greater than that of the multilayer printed circuit board of Example 1. This confirmed that the multilayer printed circuit board of Comparative Example 4 has insufficient reliability for formation of fine-pitched conductor patterns.

The invention claimed is:

1. A composite comprising a resin composition and a glass cloth disposed in the resin composition,
   wherein the resin composition has a cured storage elastic modulus of 100-2000 MPa at 20° C.;
   wherein the resin composition comprises an acrylic polymer with a weight-average molecular weight greater than 50,000;
   wherein the acrylic polymer comprises 2-20 wt % glycidyl acrylate as a polymerizing component; and
   wherein the acrylic polymer has an epoxy value of 2-36.

2. The composite according to claim 1, wherein the resin composition further comprises a viscoelastic resin.

3. The composite according to claim 1, wherein the glass cloth has a thickness of 10-200 μm.

4. The composite according to claim 1, wherein a total thickness of the composite is no greater than 200 μm.

5. The composite according to claim 1, wherein a total thickness of the composite is no greater than 100 μm.

6. The composite according to claim 1, wherein the composite possesses a perforation.

7. A prepreg obtained by semi-curing of the resin composition in the composite according to claim 1.

8. A prepreg according to claim 7, wherein the prepreg possesses a perforation.

9. A metal foil-clad laminate obtained by heating and pressing the composite according to claim 6, wherein the perforation is filled with an electric conductor, and a metal foil is situated on at least one side of the composite.

10. A metal foil-clad laminate obtained by heating and pressing the prepreg according to claim 8, wherein the perforation is filled with an electric conductor, and a metal foil is situated on at least one side of the prepreg.

11. A circuit board connection material having a perforation formed at prescribed location of the prepreg according to claim 7, and bearing a releasable film on both sides thereof, and having a conductive resin composition filling the perforation up to a surface of the releasable film.

12. A circuit board connection material having a perforation formed at prescribed location of the prepreg according to claim 7, and bearing a releasable film on both sides thereof, having a conductive resin composition filling the perforation up to a surface of the releasable film, wherein the conductive resin composition protrudes from the surface of the prepreg when the releasable film is subsequently peeled off.

* * * * *